United States Patent
Shin (10) Patent No.: US 6,603,956 B1
(45) Date of Patent: Aug. 5, 2003

(54) RADIO REPEATER USING THE NON-RADIATIVE DIELECTRIC WAVEGUIDE

(75) Inventor: Cheon Woo Shin, 13-205, Samick-Apartment 148 Namcheon-Dong, Suyong-Ku, 613-010 Pusan (KR)

(73) Assignees: Sensing Tech Corp, Pusan (KR); Cheon Woo Shin, Pusan (KR)

( * ) Notice: Subject to any disclaimer, the term of this patent is extended or adjusted under 35 U.S.C. 154(b) by 393 days.

(21) Appl. No.: 09/635,888

(22) Filed: Aug. 10, 2000

(30) Foreign Application Priority Data

Aug. 20, 1999 (KR) ........................................ 1999-34665

(51) Int. Cl.[7] .............................................. H04B 7/15
(52) U.S. Cl. .................... 455/11.1; 330/287; 333/239; 333/248; 333/1.1
(58) Field of Search ................... 330/287; 331/107 DP; 333/1.1, 239, 248

(56) References Cited

U.S. PATENT DOCUMENTS

| | | | | | |
|---|---|---|---|---|---|
| 3,818,365 A | * | 6/1974 | Hanson | ...................... | 330/53 |
| 3,889,203 A | * | 6/1975 | Eastman | ...................... | 330/56 |
| 4,013,974 A | * | 3/1977 | Quine | ......................... | 330/34 |
| 4,025,872 A | * | 5/1977 | Grayzel | ....................... | 330/34 |
| 4,517,527 A | * | 5/1985 | Aihara et al. | ................ | 330/287 |
| 4,623,849 A | * | 11/1986 | Dalman et al. | ............. | 330/287 |
| 6,414,551 B1 | * | 7/2002 | Shin | ............................ | 330/287 |
| 6,437,663 B1 | * | 8/2002 | Kii et al. | .................... | 333/137 |

\* cited by examiner

*Primary Examiner*—William Trost
*Assistant Examiner*—James D Ewart
(74) *Attorney, Agent, or Firm*—The Maxham Firm (57) ABSTRACT

A radio repeater wherein a reflective negative resistance amplifier, using the negative resistance of a Gunn diode, is applied at one side of a dielectric waveguide, enabling signals to be inputted through the input terminal dielectric waveguide, circulated in the circulator and enter the Gunn diode. Reflected waves amplified in the Gu diode exit the output terminal dielectric waveguide. A radio repeater is provided on the non-radiative dielectric waveguides using the multi-space non-radiative dielectric waveguides, which receives a frequency, amplifies it, and retransmits the amplified signals to any direction. With a dielectric band inserted in the radio repeater, directions for reception and transmission can be freely changed. Using the radio repeater, a small size radio repeater of low power consumption may be made.

2 Claims, 8 Drawing Sheets

Fig. 5 f1(Resonant frequency of the first external resonant circuit)   f0(Resonant frequency of the amplifier)   f2(Resonant frequency of the second external resonant circuit)

RADIO REPEATER USING THE NON-RADIATIVE DIELECTRIC WAVEGUIDE

BACKGROUND OF THE INVENTION

1. Field of the Invention

The present invention relates to a radio repeater, in particular, a radio repeater obtained by applying a reflective amplifier using a Gunn diode to the non-radiative dielectric waveguide (or the multi-space non-radicative dielectric waveguide).

2. Description of Prior Art

The conventional radio repeater has a complex structure because it receives radio signals, demodulates the received signals to obtain the original signals, then again modulates the original signal into a different frequency. The complex circuit of such radio repeater causes frequency interference. Because of such problem, frequencies other than the original frequency should be used. This results in waste of the frequency which is the public resource. Furthermore, the conventional radio repeater includes circuits for signal demodulation and modulation, and devices for transmission and reception, consuming a lot of electric power. Thus, complex power source devices such as a power generator and an emergency power source must be installed at the peak of a mountain or on the top of a building where such conventional radio repeater is to be installed.

SUMMARY OF THE INVENTION

In order to solve the above-described problems of the conventional radio repeater, the present invention provides a radio repeater whose circuits are simple and the construction of which is easy, because it amplifies the received waves as they are without going through demodulation, modulation, reception and transmission processes. An object of the present invention is to provide such radio repeater.

Another object of the present invention is to provide a radio repeater which consumes a small amount of electric power with simple circuits.

DETAILED DESCRIPTION OF THE PREFERRED EMBODIMENTS

In accord with the above object, the present invention provides a radio repeater using the non-radiative dielectric waveguide wherein a reflective negative resistance amplifier with the Gunn diode's negative resistance characteristics is applied to one side of the dielectric waveguide, so that the input signals are inputted through the input terminal dielectric waveguide, are circulated through the circulator and then go into the Gunn diode. The reflected waves amplified in the Gunn diode are circulated in the circulator and outputted from the output terminal dielectric waveguide.

More detailed description of the radio repeater using the non-radiative dielectric waveguides of the present invention is provided in the following with reference to the attached drawings.

The radio repeater of the present invention uses an amplifier which uses the Gunn diode. The amplifier using the Gunn diode is the negative resistance amplifier, which uses the negative resistance characteristics of the Gunn diode.

There are two conduction band valleys in a Gunn diode. One of them is the lower valley ("L valley") which is close to the valence band and the other is the upper valley ("U valley") which is higher than L valley by 0.36 eV. The electronic mobility of L valley is 60 times greater than that of U valley. If the electric field is low, all conduction electrons exist in L valley but if the electric field gets higher, the electronic energy increases and some electrons go into U valley. Because of the changes in the electronic mobility, bunching is caused and thus the average electronic speed is reduced. The difference made in the electronic mobility is a negative value and the Gunn diode is in the negative resistance state.

Figure 1:
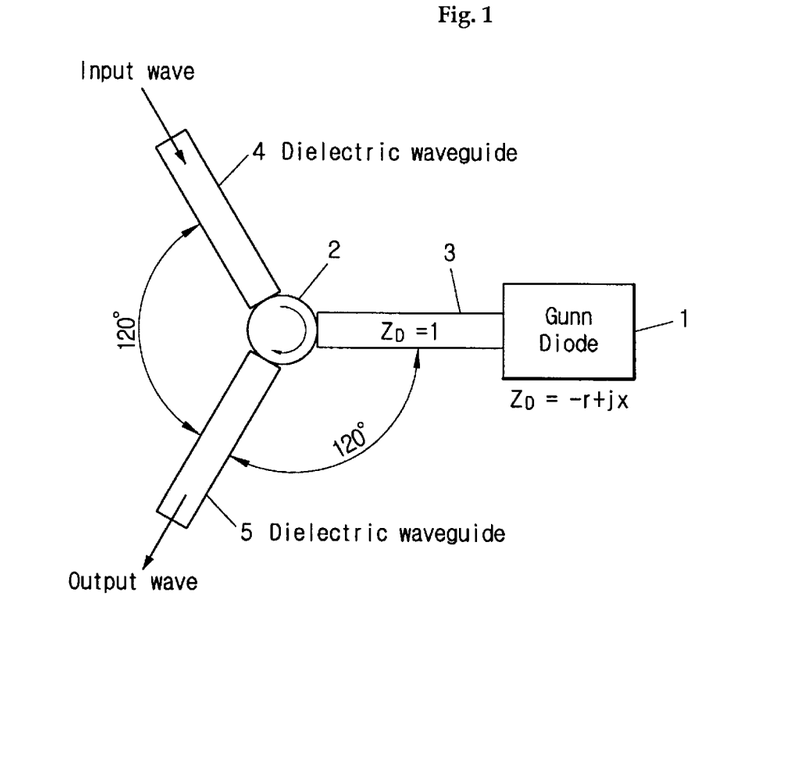
FIG. 1 is a diagram of a reflective negative resistance amplifier with a Gunn diode applied to the dielectric waveguide.

FIG. 1 is a diagram of the reflective negative resistance amplifier with the Gunn diode applied to the dielectric waveguides 3, 4 and 5. Input signals, through circulation in the circulator 2, enter Gunn diode 1. In Gunn diode 1, reflected waves are amplified from the inputted waves by the negative resistance characteristics. The amplified reflected waves, after revolved in the circulator 2, come out of the output terminal.

In FIG. 1, ZD is the impedance of Gunn diode 1, standardized at the transmission line's characteristic impedance. Here, the impedance of Gunn diode 1 is a serial circuit of the negative resistance r and the reactance x. The reflection coefficient here is as represented in the following equation 1.

$$r_N = \left| \frac{1 + r - jx}{1 - r + jx} \right| \qquad \text{[Equation 1]}$$

If we substitute 0 for x in order to make it simple, the reflection coefficient at the central frequency will be defined as in the following equation 2.

$$r_N = \left| \frac{1 + r}{1 - r} \right| > 1 \qquad \text{[Equation 2]}$$

In the above equation 2, if the reflection coefficient is bigger than 1, the reflected waves will become larger than the incident waves, thus effecting amplification. The reflection coefficient equals the gain because it is the ratio of the reflected power to the input power. Thus, the power gain is defined in accordance with the following equation 3.

$$G_D = |\gamma_N|^2 \qquad \text{[Equation 3]}$$

Equation 2 shows that as the negative resistance of Gunn diode 1 approaches the characteristic impedance of the transmission line, the gain in the amplifier increases. If the negative resistance is 1, the reflection coefficient will have a value of infinity. Thus, even when there is no incident waves, there exist output waves. As a result, oscillation occurs. In the above equation 1, the frequency characteristics of the amplifier's gain are represented with a simple peak shape which reaches the maximum value at the frequency which makes the value of reactance of Gunn diode 1 zero.

Figure 2:
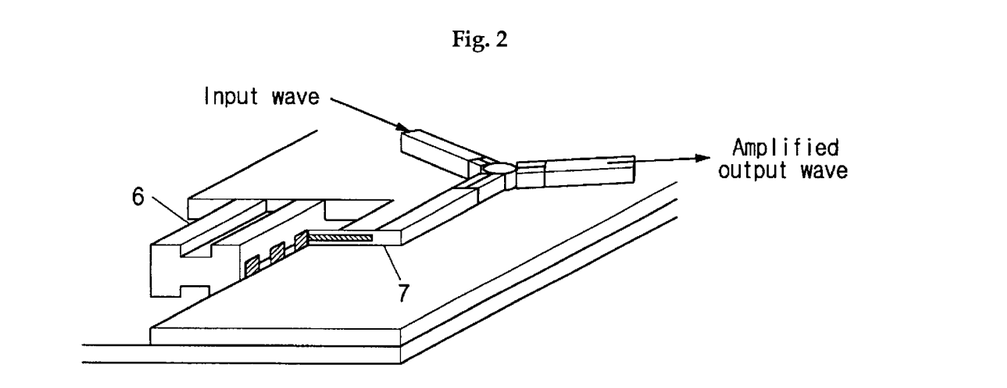
FIG. 2 is a structure diagram of a reflective amplifier applied to the multi-space non-radiative dielectric waveguide.

FIG. 2 is a structure diagram of a reflective amplifier applied to the multi-space non-radiative dielectric waveguide. Input waves in FIG. 2, after passing through the dielectric waveguide and revolving in the circulator, enter Gunn diode 6. In Gunn diode 6, because of the negative resistance characteristics, output waves, which are much stronger than the input waves, are reflected. The ratio of such output waves to the input waves is the amplification rate.

The reflected waves out of Gunn diode 6, after revolving in the circulator, pass through the dielectric waveguides on the loaded side and then are outputted. Here, the size of the Gunn diode mount must be the same as the size of the space between two metal plates where the dielectric waveguide exists. Frequencies which are actually used, however, would differ by their usage or purposes, and different frequencies require different sizes of the space between two metal plates. Thus, it is impractical to obtain a diode of a size which corresponds to all frequencies to be used. Therefore, the present invention utilizes the multi-space non-radiative dielectric waveguide to construct circuits. This enables us to construct amplification circuits with diodes of a same size and to generate various frequencies for different purposes.

Dielectric waveguides may be obtained in accordance with frequencies to be used and the space is determined in accordance with the size of the dielectric waveguide. Sizes of the diode mounts, however, differ by manufacturers. The present invention, by using the multi-space structure, may construct circuits through the spaces corresponding to elements of various different sizes.

A strip resonator 7 connects the Gunn diode and the dielectric waveguide of the present invention. The length of the metal portion in strip resonator 7 determines the frequency to be used. If the metal portion is longer than a half of the wavelength of frequency to be used, the resonance frequency becomes lower, and if the metal portion is shorter than the half of the wavelength, then the resonance frequency becomes higher.

Applying the bias voltage in the amplification circuit, which is constructed as illustrated in FIG. 2, may enable such circuit to work as an amplifier.

On the other hand, an amplifier for high frequency may also be built using Gunn diodes for low frequency. This is called a multiplying amplifier. Such multiplying amplifier may be useful, when transmission data increase and thus the frequency becomes higher, but if a Gunn diode for high frequency is not available.

Figure 3:
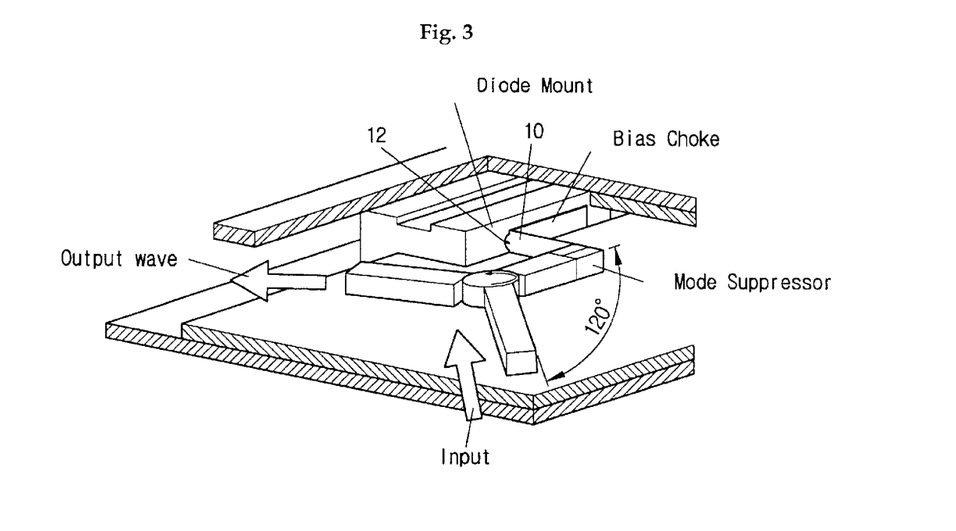
FIG. 3 is a structure diagram of a 3 times frequency multiplying amplifier applied to the multi-space non-radiative dielectric waveguide.

FIG. 3 is the structure diagram of 3 times multiplying amplifier 10 applied to the multi-space non-radiative dielectric waveguide.

In the large space of the multi-space non-radiative dielectric waveguide for a low frequency, the bias voltage is supplied so that a negative resistance would arise through low frequency Gunn diode 12. In the smaller space between two metal plates, a dielectric transmission waveguide for a frequency twice or three times higher than that of Gunn diode oscillator is located. A strip resonator 10 or a reed type resonator which resonates at a higher frequency (multiplied frequency) is located in between Gunn diode 12 and the waveguide. In this manner, a high frequency may be used and the waves may be amplified through the use of the negative resistance characteristics which amplify the reflected waves.

In order to send a large amount of information, we need to use a high frequency and broadband. In accordance with such trend, amplifiers also need to be able to process a high frequency and use a broadband. Thus, it is desirable not only to improve the amplifying function in the dielectric waveguide, but also to widen the bandwidth.

Figure 4:
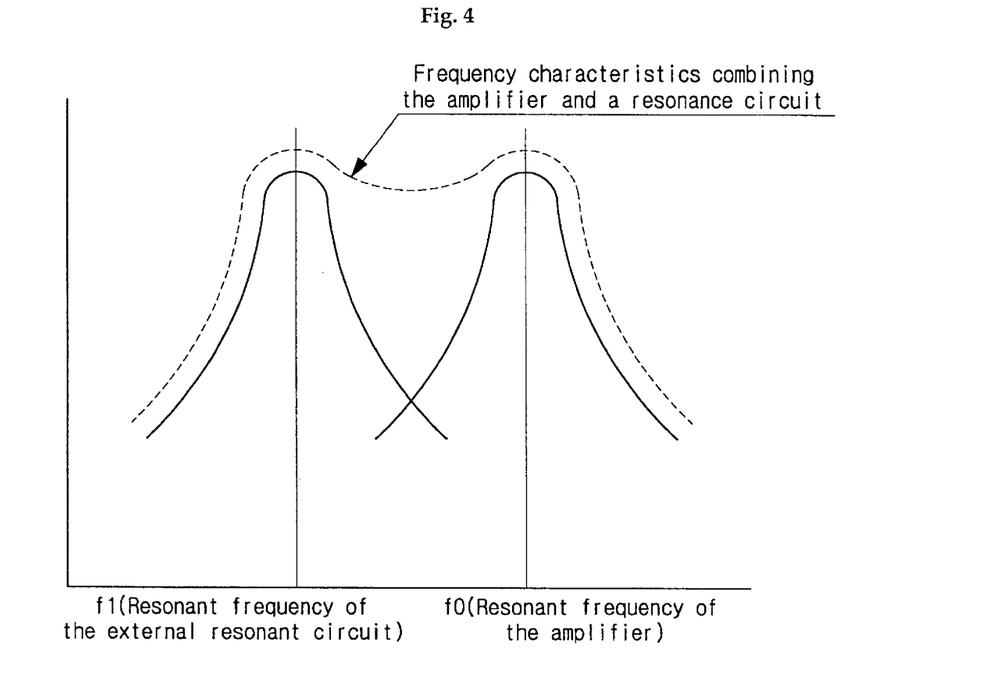
FIG. 4 is a diagram illustrating the frequency characteristics when one external resonance point is added.
Figure 5:
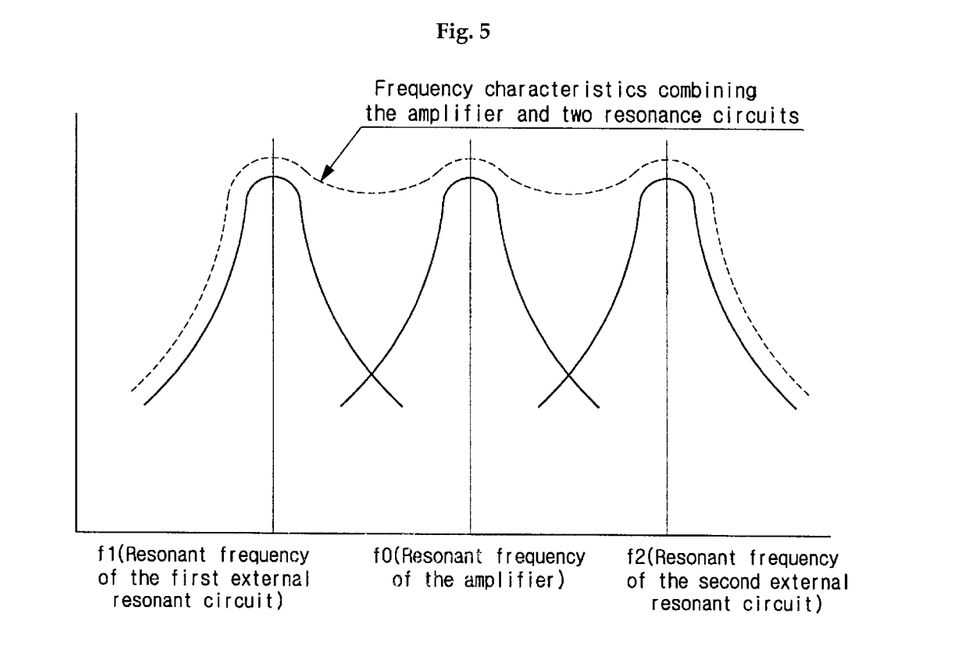
FIG. 5 is a diagram illustrating the frequency characteristics when two external resonance points are added.

In order to accomplish such purpose, the present invention implements another resonance point in addition to the original resonance point. The bandwidth of the amplified frequencies may generally be widened through such multiple resonance points. FIG. 4 is the frequency characteristics of a case where one external resonance point is added and FIG. 5 is the frequency characteristics of a case where two external resonance points are added. As shown in FIG. 4 and FIG. 5, if the external resonance point is located broadly, then broadband circuits may be built as a result. Such external resonance circuits may be made with cut-blocks of the dielectric waveguides.

Figure 6:
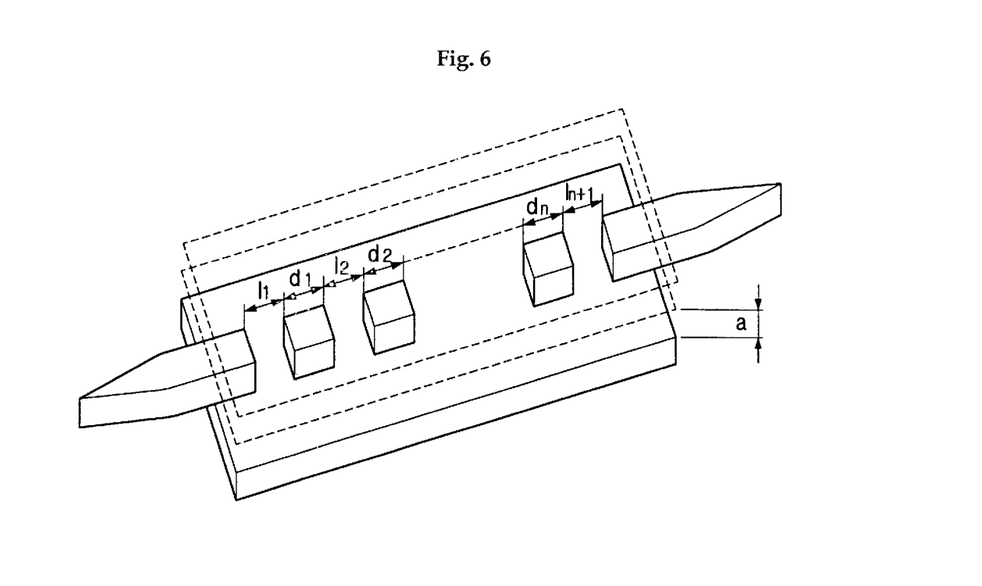
FIG. 6 is a structure diagram of a resonator using cut-blocks of the dielectric waveguide.

FIG. 6 is a structure diagram of a resonator using cut-blocks of the dielectric waveguides. Using dielectric blocks illustrated in FIG. 6, a multi-step resonator may be constructed. In the basic structure of FIG. 6, multiple resonance circuits may be designed and made with design factors $l_j$ and $d_j$. By converting and interpreting the resonance circuit of FIG. 6 into an equivalent circuit, a design formula may be induced. Using such design formula, multiple resonance circuits may be designed and constructed with dielectric blocks.

Figure 7:
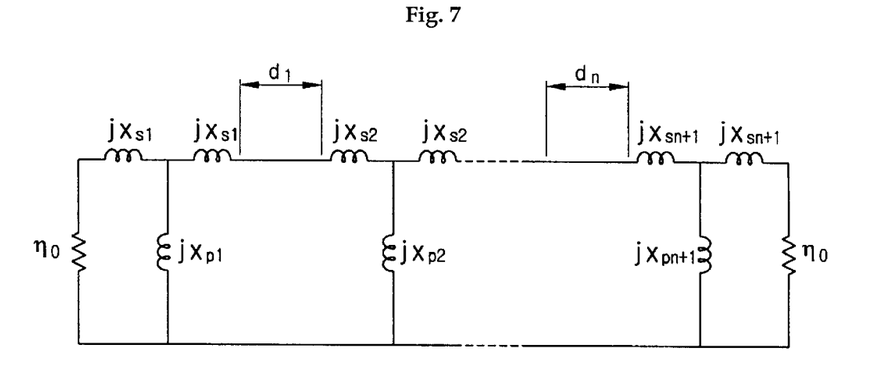
FIG. 7 is an equivalent circuit diagram of the resonator circuit illustrated in FIG. 6.

In order to get the values of l1, d1 and l2 in the basic structure of FIG. 6, the resonance circuit of FIG. 6 must be converted and interpreted into an equivalent circuit as shown in FIG. 7.

FIG. 7 is the equivalent circuit diagram of the resonance circuit of FIG. 6. The symmetrical T type circuits in FIG. 7 represents the attenuation areas. The characteristic impedance of the waveguide, $x_{pj}$, $x_{sj}$ (j=1~n+1), as the impedance of the serial arm and the parallel arm of the attenuation area, is represented as a function of 1j, the length of the attenuation area.

Figure 8:
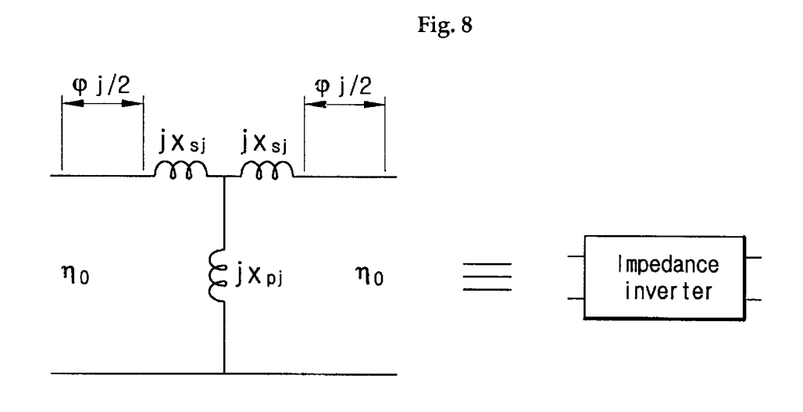
FIG. 8 is an impedance inverter circuit.
Figure 9:
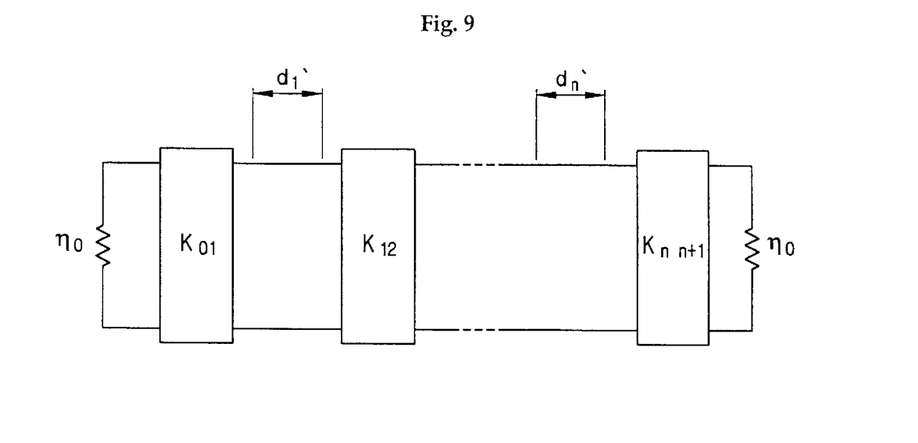
FIG. 9 is an equivalent circuit diagram of the circuit in FIG. 7, using an inverter.

When the T type circuit is constructed with an impedance inverter circuit as illustrated in FIG. 8, the circuit in FIG. 7 may be changed to a circuit in FIG. 9. Here, dj(j=1~n) are $x_{pj}$, $x_{sj}$, $x_{pj+1}$, $x_{sj+1}$ of the inserted impedance and are represented with the circuit's phase constant β. Thus, a resonance circuit may be designed in accordance with equations 4 and 5 in FIG. 7.

$$\omega_\lambda = \left(\frac{\lambda_{g0}}{\lambda_0}\right)^2 \frac{\Delta f}{f_0} \quad \text{[Equation 4]}$$

$$d_j = \frac{1}{\beta}\left\{m\pi - \frac{1}{2}\left(\tan^{-1}\frac{2x_{pj}+x_{sj}}{H_D} + \tan^{-1}\frac{x_{sj}}{H_D} + \tan^{-1}\frac{2x_{pj+1}+x_{sj+1}}{H_D} + \tan^{-1}\frac{x_{sj+1}}{H_D}\right)\right\} \quad \text{[Equation 5]}$$

Figure 10:
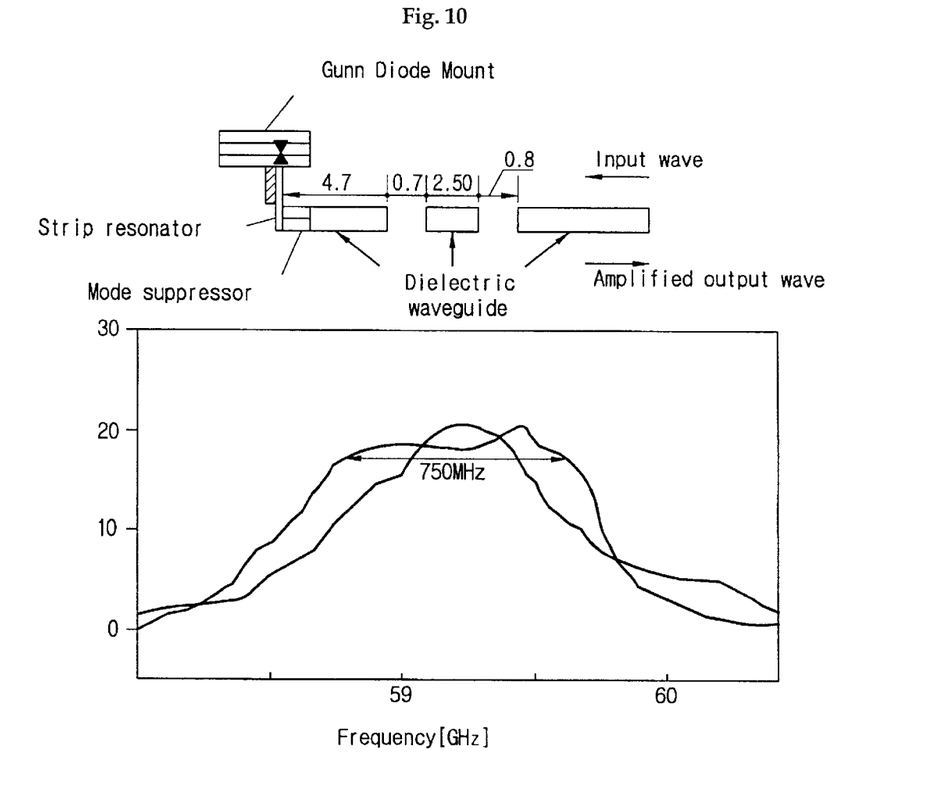
FIG. 10 is a structure diagram of a broad band amplification circuit designed through use of the Gunn diode amplifier and one external dielectric resonance circuit, with illustration of the frequency characteristics.

FIG. 10 is a structure diagram of a broadband amplification circuit designed with the Gunn diode amplifier and one external dielectric resonance circuit, together with the frequency characteristics. FIG. 10 shows that the bandwidth of the amplifier made only with the Gunn diode is approximately 300 MHz, but with an external resonance circuit, the bandwidth increases to be approximately 750 MHz.

The following is the detailed description of the radio repeater using the Gunn diode amplifier in the non-radiative dielectric waveguide or the multi-space non-radiative dielectric waveguide).

Figure 11:
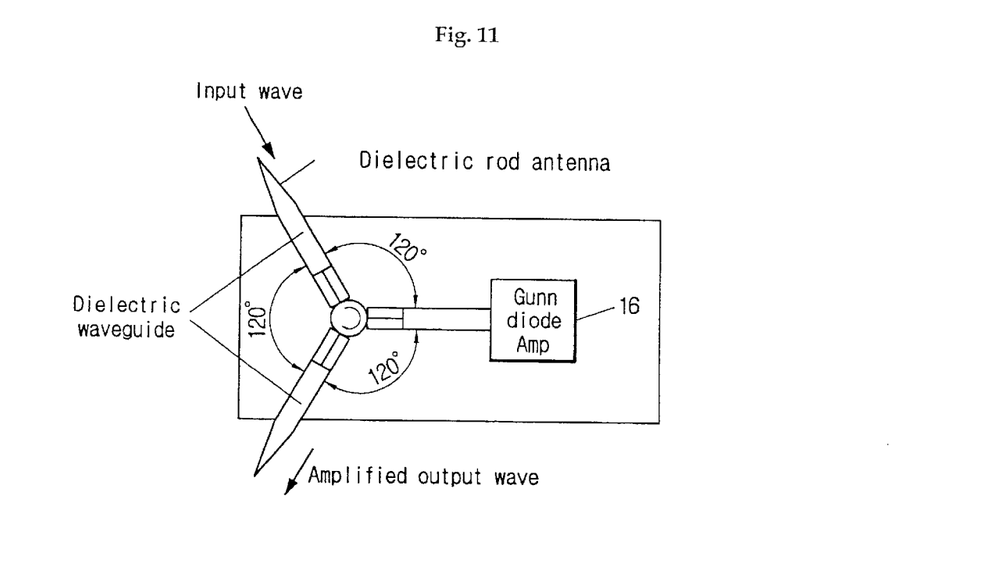
FIG. 11 is a diagram of a radio repeater using a Gunn diode amplifier in the non-radiative dielectric waveguide (or the multi-space non-radiative dielectric waveguide).

FIG. 11 is a diagram of a radio repeater using Gunn diode amplifier 16 in the non-radiative dielectric waveguide (or the multi-space non-radiative dielectric waveguide). As illustrated in FIG. 11, in the radio repeater using Gunn diode amplifier 16 in the non-radiative dielectric waveguide (or the multi-space non-radiative dielectric waveguide), input waves are immediately amplified in the Gunn diode, separated in the circulator and are outputted. Thus, an amplifying radio repeater of high efficiency and high frequency may be constructed, which has a high amplification efficiency at a low power level.

The radio repeater of the present invention, differently from the conventional radio repeater, amplifies the received waves directly, using the Gunn diode's negative resistance characteristics. Thus, the radio repeater of the present invention does not need to have processes for demodulation, modulation, reception or transmission. This makes it possible to make a small and high efficiency radio repeater easily with simple circuits.

As illustrated in FIG. 11, the low level incident waves into the radio repeater enter the Gunn diode through the circulator. The amplified waves from the Gunn diode are is revolved by 120 degrees in the circulator. The radio repeater, however, should be able to output amplified signals to any desired direction from the top of a building or a mountain where such repeater is installed. If the angle between the input and output direction is maintained as 120 degrees as illustrated in FIG. 11, signals may not be sent to desired directions and such radio repeater may not be useful for high frequencies with high directivity, such as milli-waves.

Figure 12:
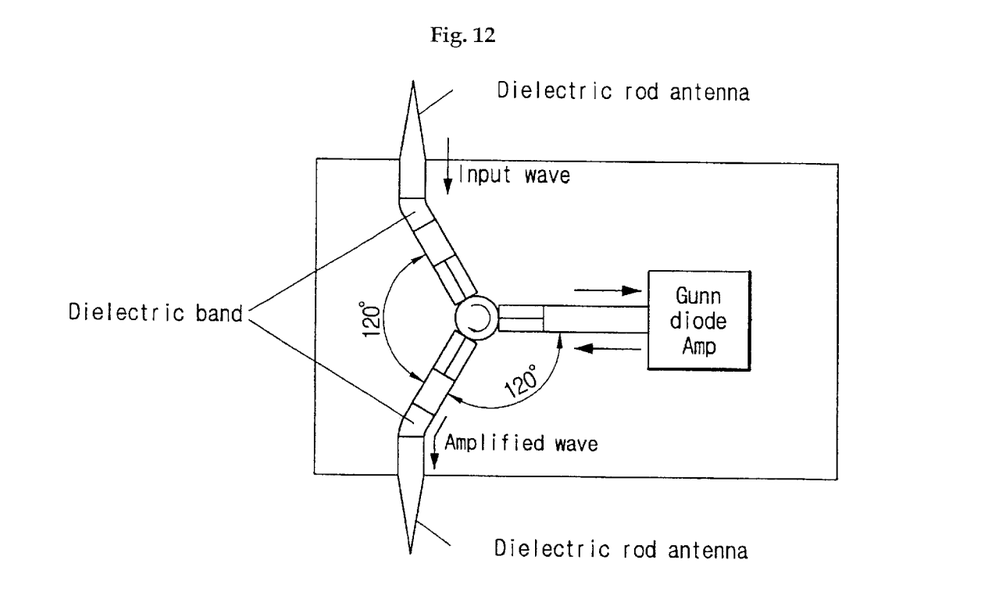
FIG. 12 is a structure diagram of a radio repeater of the present invention with lossless bands inserted into the input and output dielectric waveguides for eazy direction changes.

In order to solve such problem, the present invention provides a radio repeater with lossless bands in the input and output dielectric waveguides, which will have little loss in signals and which may change the signals' direction freely. FIG. 12 is a structure diagram of a radio repeater of the present invention with a lossless bands inserted into the input and output dielectric waveguides for easy direction changes. As illustrated in FIG. 12, by inserting lossless bands between the dielectric waveguides and antennae, input and output antennae would form right angles from the jig.

Figure 13:
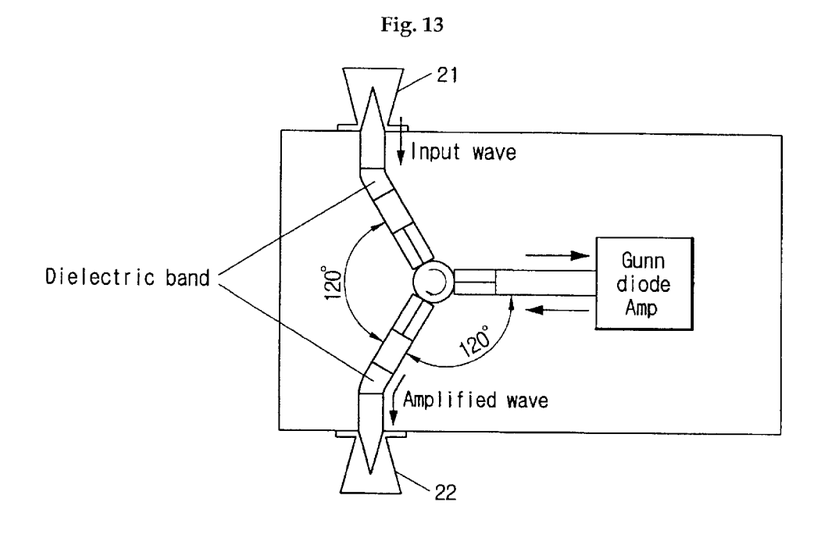
FIG. 13 is a structure diagram of a radio repeater of the present invention with enhanced directivity and improved gain.

FIG. 13 is a structure diagram of a radio repeater of the present invention with an enhanced directivity and a raised gain. In a radio repeater illustrated in FIG. 13, in order to improve the gain, antennae combining dielectric antennae and horn antennae 21 and 22 are used instead of dielectric antennae.

Figure 14:
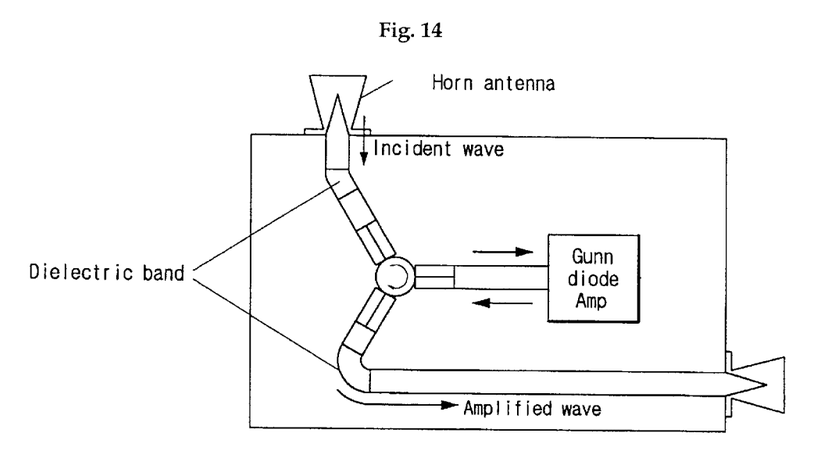
FIG. 14 is a structure diagram of a radio repeater of the present invention using lossless bands, creating an angle of 270 degrees from input direction to output direction.

In order to send and receive signals to and from various directions, bands with various angles may be made and combined to change directions of reception and transmission signals. FIG. 14 is a structure diagram of a radio repeater of the present invention using a lossless band with 270 degrees from input direction to output direction.

Figure 15:
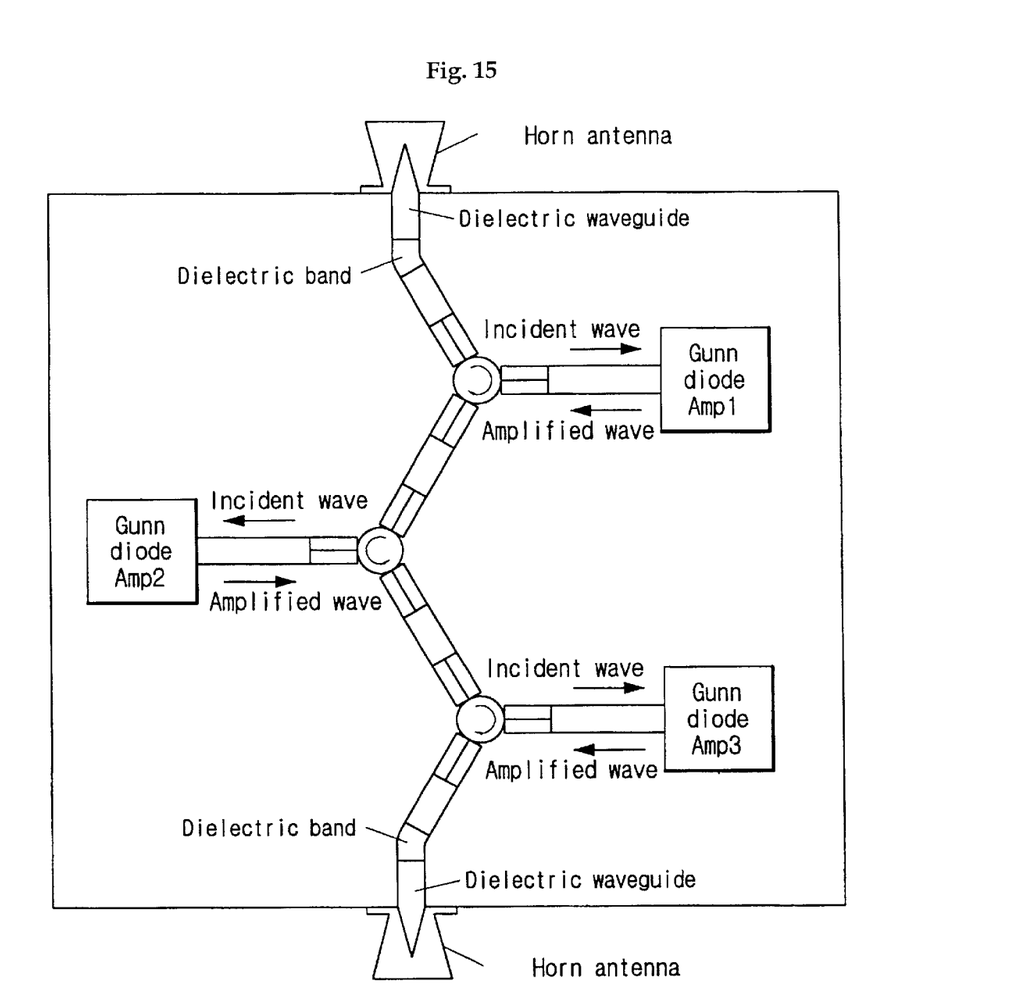
FIG. 15 is a structure diagram of a radio repeater of the present invention using lossless bands and multiple amplifiers.

If amplification by one amplifier is not sufficient, multiple amplifiers may be used to raise the amplification level. For example, if the received signals are of the level of –80 dbm, and if three amplifiers with the maximum amplification gain of 30 db are connected together, an amplifier with 90 db gain may be obtained. Consequently, input signals at the level of –80 dbm may be amplified to become +10 dbm signals. Through the antennae, these signals may be outputted from the high-output radio repeater. FIG. 15 is a structure diagram of a radio repeater of the present invention using a lossless band and multiple amplifiers.

Because power amplification should be made at the part where final output is amplified, the Gunn diode may not be able to generate high level outputs. In such case, multiple Gunn diodes may be connected in parallel for high output circuits.

In place of the conventional radio repeater with a complicated structure, the present invention provides a radio repeater on the non-radiative dielectric waveguides and a radio repeater using the multi-space non-radiative dielectric waveguides, which receives a frequency, amplifies the frequency as received, and retransmits the amplified signals to any desired direction. Because the internal circuit of the radio repeater of the present invention is of an amplifier structure using Gunn diodes, the circuit is simple and, thus, power consumption may be reduced. Furthermore, by inserting dielectric bands, directions for reception and transmission can be freely changed. Using the radio repeater of the present invention, a small size radio repeater of low power consumption may be made. The radio repeater of the present invention may also be applied to a directional repeater for indoor milli-wave LAN.

What is claimed is:

1. A radio repeater using the non-radiative dielectric waveguide wherein:

a reflective negative resistance amplifier using the negative resistance of a Gunn diode is applied at one side of a dielectric waveguide;

input signals are inputted through the input terminal dielectric waveguide, revolve in the circulator and enter the Gunn diode; and the reflected waves amplified in the Gunn diode, after being circulated in the circulator, come out of the output terminal dielectric waveguide, wherein if the size of the Gunn diode does not fit the dielectric waveguide, dielectric waveguides and elements of various different sizes are installed in the multi-space structure and a strip resonator connects such waveguides and the elements for amplification.

2. A radio repeater using the non-radiative dielectric waveguide wherein:

a reflective negative resistance amplifier using the negative resistance of a Gunn diode is applied at one side of a dielectric waveguide;

input signals are inputted through the input terminal dielectric waveguide, revolve in the circulator and enter the Gunn diode; and the reflected waves amplified in the Gunn diode, after being circulated in the circulator, come out of the output terminal dielectric waveguide, wherein if the Gunn diode has low frequency and an amplification rate is high, high frequency amplification characteristics are obtained using the high frequency oscillation characteristics of the Gunn diode.

* * * * *